United States Patent
Farrar (10) Patent No.: US 7,705,429 B2
(45) Date of Patent: *Apr. 27, 2010

(54) EPITAXIAL SEMICONDUCTOR LAYER AND METHOD

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/364,073

(22) Filed: Feb. 2, 2009

(65) Prior Publication Data

US 2009/0166806 A1 Jul. 2, 2009

Related U.S. Application Data

(60) Continuation of application No. 11/428,959, filed on Jul. 6, 2006, now Pat. No. 7,489,019, which is a division of application No. 10/914,292, filed on Aug. 9, 2004, now Pat. No. 7,172,949.

(51) Int. Cl.
 H01L 29/207 (2006.01)
 H01L 29/227 (2006.01)
 H01L 29/167 (2006.01)
 H01L 21/762 (2006.01)
 H01L 21/04 (2006.01)
 H01L 21/265 (2006.01)

(52) U.S. Cl. ............... 257/609; 257/607; 257/E21.043; 257/E21.057; 257/E21.343; 257/E21.567

(58) Field of Classification Search ................. 257/609, 257/607, E21.043, E21.057, E21.343, E21.567
See application file for complete search history.

(56) References Cited

U.S. PATENT DOCUMENTS

| | | | | |
|---|---|---|---|---|
| 4,916,088 A | * | 4/1990 | Mooney et al. | ............. 438/493 |
| 5,231,298 A | | 7/1993 | Daly | |
| 5,654,583 A | | 8/1997 | Okuno et al. | |
| 6,074,892 A | | 6/2000 | Bowers et al. | |
| 6,153,495 A | | 11/2000 | Kub et al. | |
| 6,335,263 B1 | | 1/2002 | Cheung et al. | |
| 6,426,522 B1 | * | 7/2002 | Kean et al. | .................. 257/191 |
| 6,518,150 B1 | | 2/2003 | Matsumoto | |
| 6,667,489 B2 | * | 12/2003 | Suzumura et al. | ............. 257/12 |
| 6,744,079 B2 | * | 6/2004 | Jagannathan et al. | ........ 257/197 |
| 6,746,937 B2 | | 6/2004 | Beaman | |
| 6,781,156 B2 | * | 8/2004 | Drobnis et al. | ................. 257/77 |
| 6,908,798 B1 | | 6/2005 | Bhattacharyya et al. | |
| 6,930,360 B2 | | 8/2005 | Yamauchi et al. | |
| 7,071,014 B2 | | 7/2006 | Currie et al. | |
| 7,172,949 B2 | | 2/2007 | Farrar | |
| 7,489,019 B2 | | 2/2009 | Farrar | |
| 2004/0121524 A1 | | 6/2004 | Farrar et al. | |
| 2004/0212046 A1 | | 10/2004 | Farrar et al. | |
| 2005/0084195 A1 | | 4/2005 | Hamann et al. | |
| 2006/0030121 A1 | | 2/2006 | Farrar | |

* cited by examiner

*Primary Examiner*—Luan C Thai
(74) *Attorney, Agent, or Firm*—Schwegman, Lundberg & Woessner, P.A.

(57) ABSTRACT

A method for epitaxially forming a first semiconductor structure attached to a second semiconductor structure is provided. Devices and methods described include advantages such as reduced lattice mismatch at an epitaxial interface between two different semiconductor materials. One advantageous application of such an interface includes an electrical-optical communication structure. Methods such as deposition of layers at an elevated temperature provide easy formation of semiconductor structures with a modified lattice constant that permits an improved epitaxial interface.

20 Claims, 7 Drawing Sheets

EPITAXIAL SEMICONDUCTOR LAYER AND METHOD

RELATED APPLICATIONS

This application is a continuation of U.S. application Ser. No. 11/428,959, filed Jul. 6, 2006 now U.S. Pat. No. 7,489,019, which is a divisional under 37 CFR 1.53(b) of U.S. application Ser. No. 10/914,292, filed Aug. 9, 2004, now U.S. Pat. No. 7,172,949, which applications are incorporated herein by reference in their entirety.

TECHNICAL FIELD

This invention relates to semiconductor devices and semiconductor device fabrication. Specifically this invention relates to epitaxial semiconductor layers and methods or their formation.

BACKGROUND

As the minimum feature size achievable in semiconductor manufacturing decreases, the number of devices that can be formed in a given area increases with the inverse square of this feature size. As the areal density of devices is raised, both the device size and inter-device distances must shrink accordingly. At the same time the maximum size of a chip which can be economically produced has continuously increased. This has lead to an unprecedented increase in the complexity of chips and a need for the rapid movement of large amounts of data both within and between adjacent chips and from the chips to the world beyond. This has lead to numerous levels of interconnect on a chip as well as the requirement for higher and higher input/output connections.

One design improvement to address problems listed above includes the use of optical communication instead of electrical communications between devices on a chip and between chips. Semiconductors other than silicon are desirable to form highly effective optical communication structures. Semiconductor materials such as gallium arsenide (GaAs) can easily convert electrical signals to optical and optical to electrical. It would therefore be desirable to connect a portion of silicon semiconductor to a GaAs interface. A useful technique to couple a semiconductor such as GaAs to silicon includes epitaxially growing GaAs areas on silicon chips. One problem with this approach is that the lattice constant of GaAs does not match the lattice constant of silicon, thus causing strain or defects at the silicon/GaAs interface. Although silicon and GaAs are used as an example, interfaces between other semiconductor materials pose similar lattice mismatch problems.

What is needed is an improved method to form an epitaxial layer of semiconductor of one type over a semiconductor of another type to reduce lattice mismatch. In one specific embodiment, what is needed is a method to form a GaAs layer on a silicon surface with improved interfacial characteristics.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled. The term host matrix refers to a material as used in a composite structure such as a semiconductor matrix with dopant impurities. The term host lattice refers to a structure or regular pattern of atoms within the host matrix.

Figure 1A:
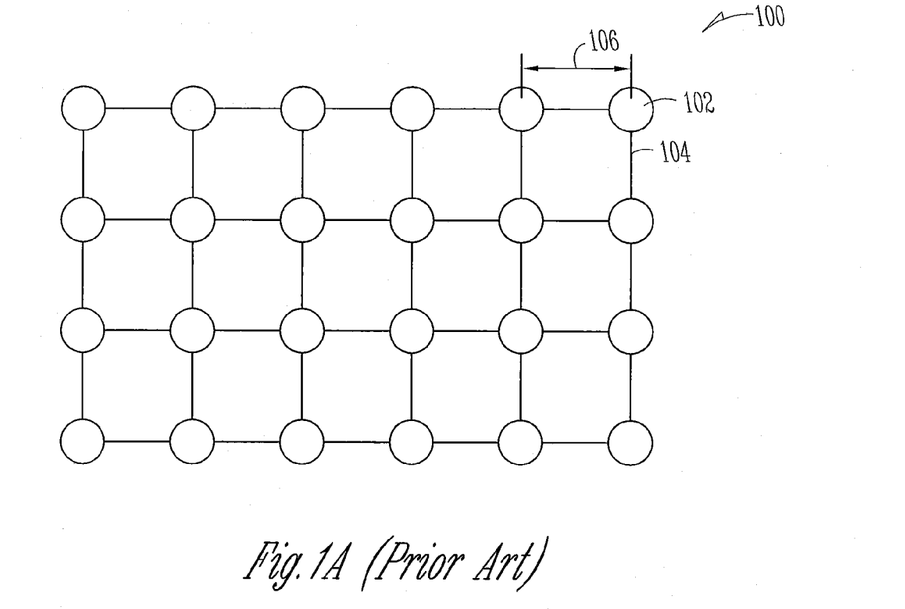
FIG. 1A shows a model of an undistorted semiconductor material according to an embodiment of the invention.

FIG. 1A shows one embodiment of a single element semiconductor lattice 100. The lattice 100 is made up of a number of host atoms 102 that are held together by bonds 104. Although a two dimensional lattice is shown for illustration, one of ordinary skill in the art will recognize that the concepts described below apply to three dimensional lattices. The lattice 100 of FIG. 1A includes a lattice constant 106. Examples of single element semiconductors include, but are not limited to silicon (Si) and germanium (Ge).

Figure 1B:
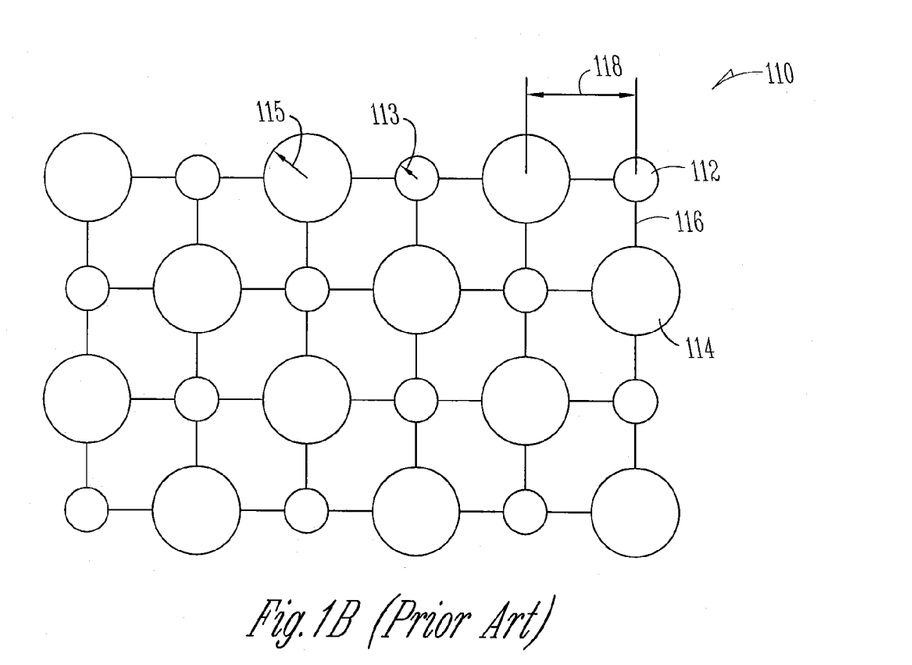
FIG. 1B shows a model of an undistorted two element semiconductor material according to an embodiment of the invention.

FIG. 1B shows one embodiment of a multiple element semiconductor lattice 110. The lattice 110 includes a first element 112 with a first atomic radius 113 and a second element 114 with a second atomic radius 115. The lattice 110 includes an average atomic radius of:

$$r_{av} = \frac{(r1 + r2)}{2}$$

The elements of the lattice 110 are held together by bonds 116. Similar to the single element lattice described in FIG. 1A, although a two dimensional lattice is shown for illustration, one of ordinary skill in the art will recognize that the concepts described below apply to three dimensional lattices. The lattice 110 of FIG. 1B includes a lattice constant 118. Examples of multiple element semiconductors include gallium arsenide (GaAs) and indium phosphide (InP) for example.

Although dimensions of FIGS. 1A and 1B are not to scale, the lattice constant 106 is shown as slightly smaller than the lattice constant 118. It is common for different semiconductors to have different lattice constants. In an epitaxial growth application, atoms of a semiconductor attempt to line up with atoms on the surface where the structure or layer is being grown. If there is a lattice mismatch, the structure or layer being grown will be strained, and may not adhere to the surface where the structure is being grown.

Figure 2A:
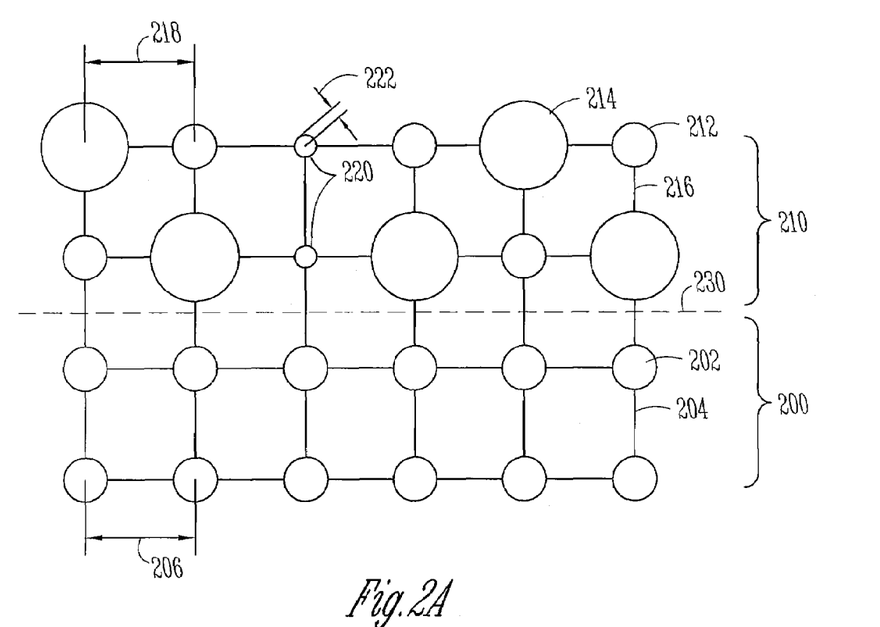
FIG. 2A shows an interface between structures according to an embodiment of the invention.

FIG. 2A shows a first semiconductor structure 200 with a second semiconductor structure 210 attached epitaxially to the first semiconductor structure 200. An interface 230 is shown between the first semiconductor structure 200 and the second semiconductor structure 210. In one embodiment, the first semiconductor structure includes a single element semiconductor. In one embodiment, the first semiconductor structure includes crystalline silicon. Although silicon is used as an example, other semiconductors including, but not limited to germanium, gallium arsenide, indium phosphide, etc. can be used as the first semiconductor structure 200. Similar to the single element semiconductor shown in FIG. 1A, the first semiconductor structure 200 includes a number of atoms 202 that are attached to each other with bonds 204. The first semiconductor structure 200 includes a lattice constant 206 as shown.

In one embodiment, the second semiconductor structure 210 includes a semiconductor material that is different from the material of the first semiconductor structure 200. In one embodiment, the second semiconductor structure 210 includes gallium arsenide. Similar to the multiple element semiconductor shown in FIG. 1B, the second semiconductor structure 210 includes a number of first atoms 212, and a number of second atoms 214 that are attached to each other with bonds 216. Gallium arsenide exhibits a lattice spacing that is approximately 5.5% larger than silicon. In its intrinsic form, gallium arsenide does not grow well on silicon, and tends to separate due to the lattice mismatch.

In one embodiment, an impurity element 220 is chosen for addition to the matrix of the second semiconductor structure 210. In one embodiment, the impurity element 220 has an atomic radius 222 that is different from an average atomic radius of the host matrix. In one embodiment where the second semiconductor structure 210 host matrix is gallium arsenide, the impurity element 220 includes carbon. Examples of different atomic radii include silicon (1.173 Å); gallium (1.245 Å); arsenic (1.21 Å); and carbon (0.77 Å). The atomic radii numbers shown are primarily for relative comparison between elements. This is because atoms can be assigned more than one radii depending on the character of the solid that they are present in i.e. metallic, single bond covalent, etc.

An amount of the impurity element 220 is selected to modify the lattice constant 218 of the second semiconductor structure 210. In one embodiment, the goal of modifying the lattice constant 218 of the second semiconductor structure 210 is to reduce an amount of lattice mismatch with respect to the first semiconductor structure 200. FIG. 2A shows the lattice constant 218 being modified to approximately the same dimension as the lattice constant 206 of the first semiconductor structure 200. By reducing the lattice mismatch, it becomes practical to attach a second semiconductor structure 210 to a first semiconductor structure 200 as shown in FIG. 1A. Other embodiments include modifying the lattice constant 218 of the second semiconductor structure 210 in a controlled manner to adjust it to a non-intrinsic value of lattice constant.

One advantage of an element such as carbon for an impurity element 220 includes a low or non-existent electrical effect of the impurity element 220 on the host matrix. In one embodiment, other impurity elements such as boron, phosphorus, etc. are used as impurity elements. In one embodiment an electrical effect of impurity elements on the host matrix is controlled by selecting amounts of impurity elements to offset each other electrically. Single impurity elements are used in selected embodiments within a host matrix, however multiple impurity elements are used in other embodiments. In one embodiment, elements with a valance of 4 are chosen. One advantage of elements with a valence of 4 includes the ability to substitute within a silicon lattice without changing the charge of the host matrix. In another embodiment, elements of other valences are substituted for a host element of the same valance.

Figure 2B:
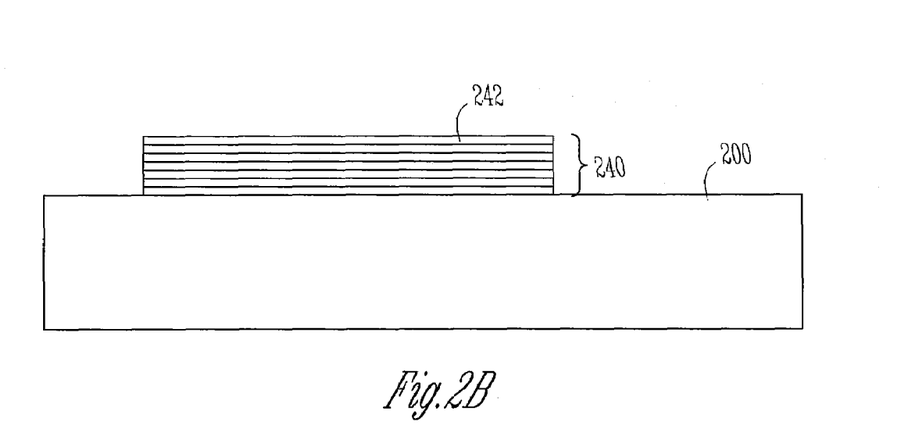
FIG. 2B shows a block diagram of a stage in processing an interface according to an embodiment of the invention.

FIG. 2B shows a step from one method of forming a second semiconductor structure 210 as described above. The first semiconductor structure 200 is shown as a substrate, or other structure. In one embodiment, the first semiconductor structure 200 includes a silicon wafer. In one embodiment, to form the second semiconductor structure 210, a number of layers 240 are formed on a surface of the first semiconductor structure 200. Individual layers 242 are shown in FIG. 2B as part of the number of layers 240. For illustration, only a few layers 242 are shown, however, as described below, much larger numbers of layers are within the scope of the invention. Although layer deposition is described, other methods of introducing impurity elements such as implantation, etc. are within the scope of the invention.

In one embodiment, the layers 242 are formed using atomic layer deposition to form monolayers. Other possible techniques include chemical vapor deposition, physical vapor deposition, sputtering, evaporation, etc. One advantage of atomic layer deposition includes shorter atomic diffusion/movement distances as will be discussed below. Using the gallium arsenide on silicon example described above, the lattice mismatch is approximately 5.5%. In one embodiment, approximately 13.9 atomic percent carbon is added to the gallium arsenide to modify the GaAs lattice constant to match silicon. In one embodiment, using a number of layers 240, a deposition routine includes the following layers: Ga/As/Ga/As/Ga/As/Ga/As/C/Ga/As/Ga/As/Ga/As/C/Ga/As/Ga/As/Ga/As/C.

This sequence can be repeated as many times as necessary until a desired thickness for the second semiconductor structure 210 is achieved. In one embodiment, the deposition process of the number of layers 240 is performed at a temperature that is high enough for the individual layers to reorganize themselves into a modified second semiconductor structure 210. In one embodiment an elevated temperature is applied during deposition, however the temperature can be applied after deposition. As discussed above, one advantage of atomic layer deposition includes the short distances that atoms in the layers 242 are required to move for reorganization. In one embodiment, the elevated temperature is approximately 500 degrees Celsius, which is high enough to promote reorganization in the number of layers 240, yet not so high as to negatively impact other structures in an integrated circuit, memory device, etc.

A number of possibilities exist for location of impurity atoms within the host matrix. The locations depend at least in part on the choice of impurity element and the choice of the host matrix. Within a given system, some locations are more energetically favorable than others due to geometry of the host lattice, bonding characteristics of the elements in the system, etc. In one embodiment, impurity atoms are incorporated into the host matrix as substitutional atoms as shown in FIG. 2A. In one embodiment, impurity atoms reside as doublets with carbon atoms residing on adjacent Ga and As positions, in an eight atom GaAs lattice unit cell.

Although not limited to these examples, other layer deposition combinations include indium phosphide on silicon with a deposition sequence of the following layers: In/P/In/P/C/In/P/In/P/In/P/C/In/P/In/P/C/In/P/In/P/C. This sequence can be repeated as many times as necessary until a desired thickness is achieved. Another combination includes GaAs on germanium with a deposition sequence of the following layers: Ga/As/Ga/As (15 total layers of Ga and As)/C. This sequence can be repeated as many times as necessary until a desired thickness is achieved. Another combination includes InP on germanium with a deposition sequence of the following layers: In/P/In/P/In/P/In/P/In/P/In/P/In/P/In/P/C/In/P/In/P/In/P/In/P/In/P/In/P/C. This sequence can be repeated as many times as necessary until a desired thickness is achieved. Another combination includes GaAs on silicon using a boron impurity element. An example a deposition layer sequence includes: Ga/As/Ga/As/B/As/Ga/As/Ga/As/B/As/Ga/As/Ga/As/B. This sequence can be repeated as many times as necessary until a desired thickness is achieved. In this case Boron is substituted for a portion of the Gallium in the epitaxial layer.

Figure 3:
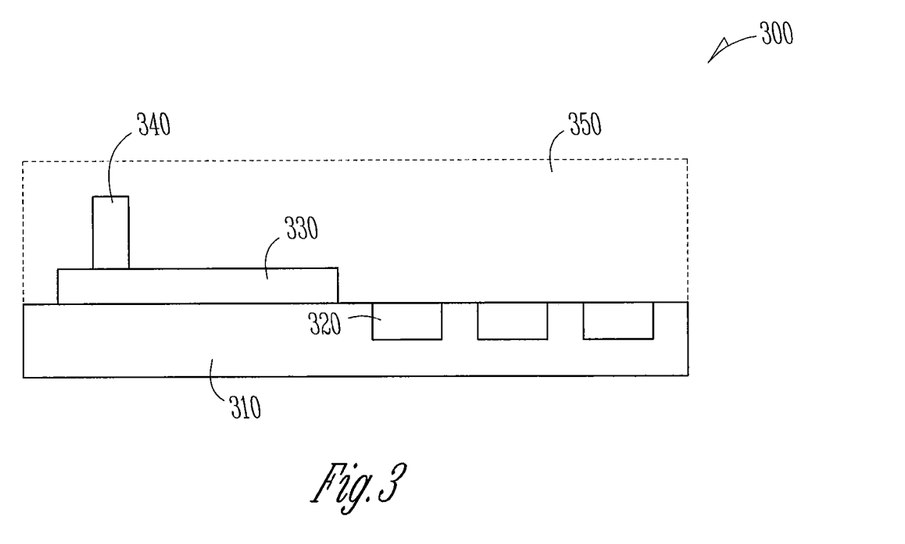
FIG. 3 shows a block diagram of an integrated circuit according to an embodiment of the invention.

FIG. 3 shows an integrated circuit 300 incorporating embodiments as described above. A substrate 310 is shown with a number of electronic devices 320 formed on or within the substrate 310. In one embodiment, the substrate 310 includes a silicon chip, and the number of electronic devices 320 includes transistors. In one embodiment, a semiconductor structure such as a mesa 330 is formed over at least a portion of the substrate 310. In one embodiment, the mesa 330 is formed using impurity elements as described in embodiments above. An optical waveguide 340 is shown coupled to at least a portion of the mesa structure 330. Additional chip structure 350 such as further layers, packaging, etc. is represented as a block in ghost lines.

As described above, the optical waveguide can be used to transmit signals between devices, between circuit, between chips, etc. quickly and without generating resistive heat as in electrically conducting elements. The mesa 330 provides a material that is suited to optical transmission, while the substrate is suited for formation of other structures and electronic devices 320.

Figure 4:
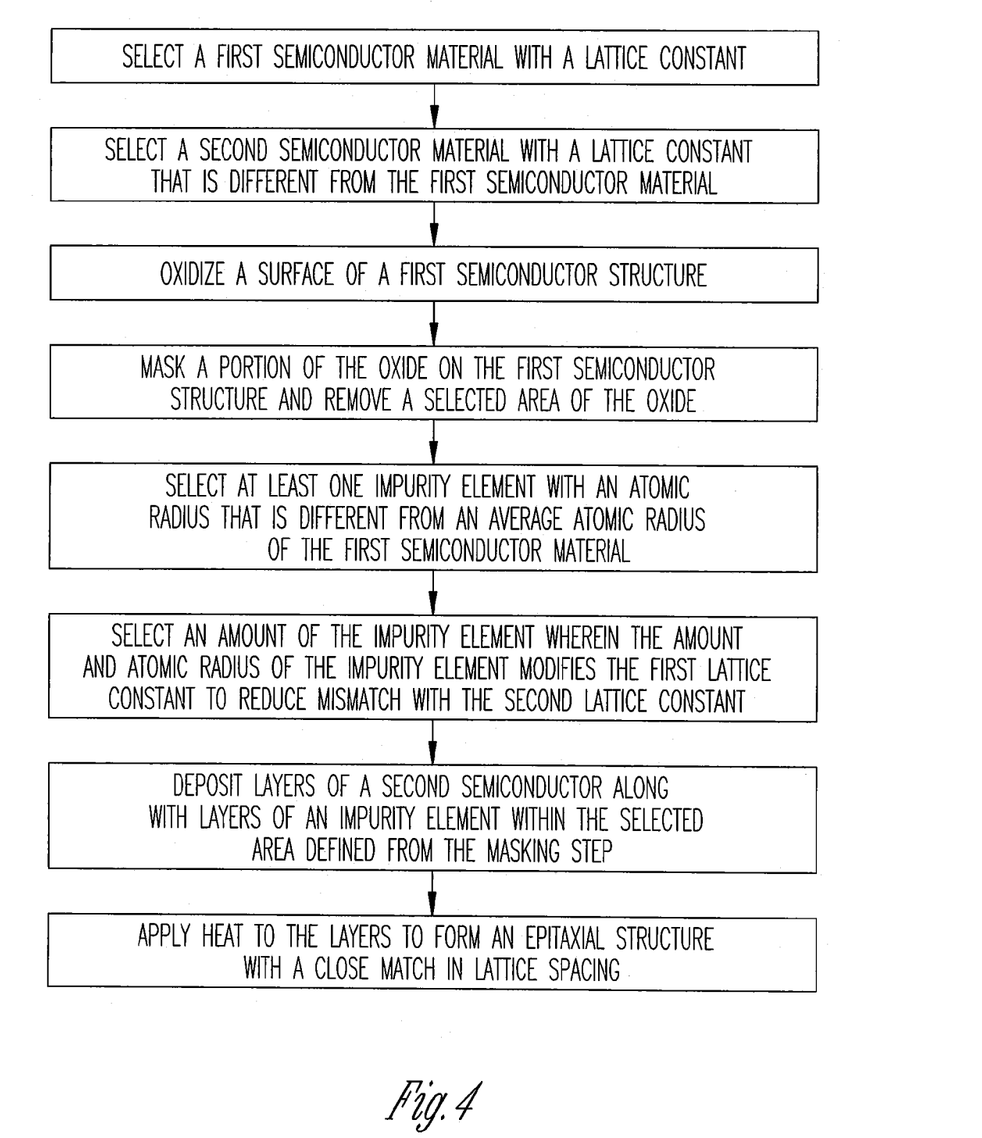
FIG. 4 shows a flow diagram according to an embodiment of the invention.

FIG. 4 shows one method of forming interfaces using embodiments described above. One step includes selecting a first semiconductor material with a lattice constant. Another step includes selecting a second semiconductor material with a lattice constant that is different from the first semiconductor material. Oxidize a surface of a first semiconductor structure. Another step includes masking a portion of the oxide on the first semiconductor structure and remove a selected area of the oxide. Another step includes selecting at least one impurity element with an atomic radius that is different from an average atomic radius of the first semiconductor material. Another step includes selecting an amount of the impurity element wherein the amount and atomic radius of the impurity element modifies the first lattice constant to reduce mismatch with the second lattice constant. Another step includes depositing layers of a second semiconductor along with layers of an impurity element within the selected area defined from the masking step. Another step includes applying heat to the layers to form an epitaxial structure with a close match in lattice spacing. Although FIG. 4 shows one method, the invention is not so limited. Other orders of steps are possible. Other methods are included with different steps, fewer steps, or additional steps.

Figure 5:
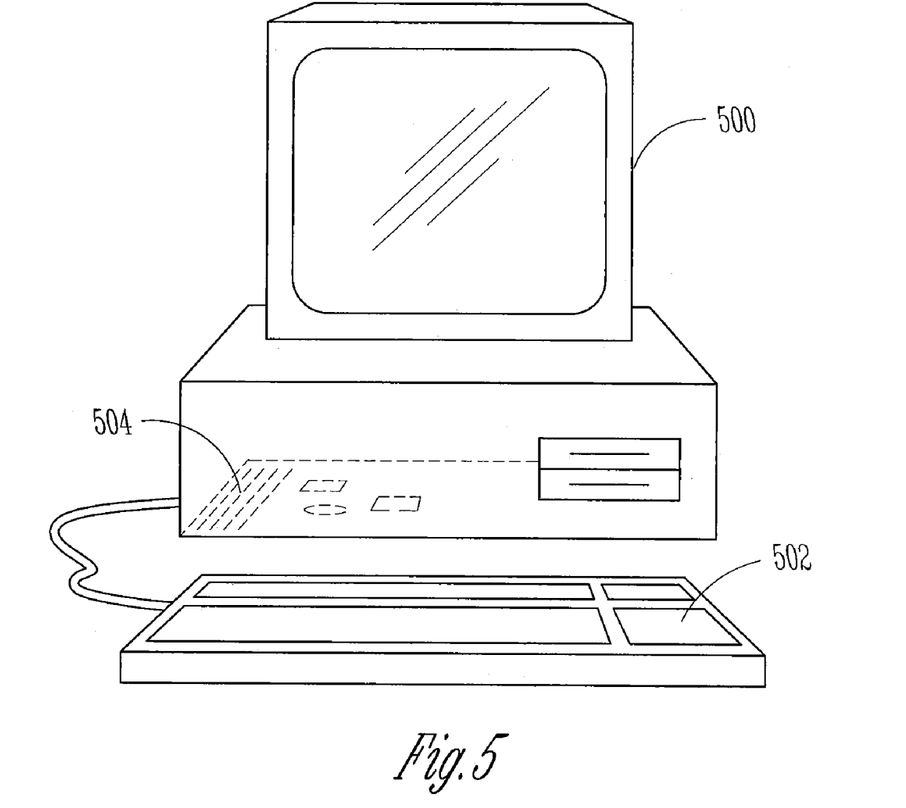
FIG. 5 shows an information handling system according to an embodiment of the invention.
Figure 6:
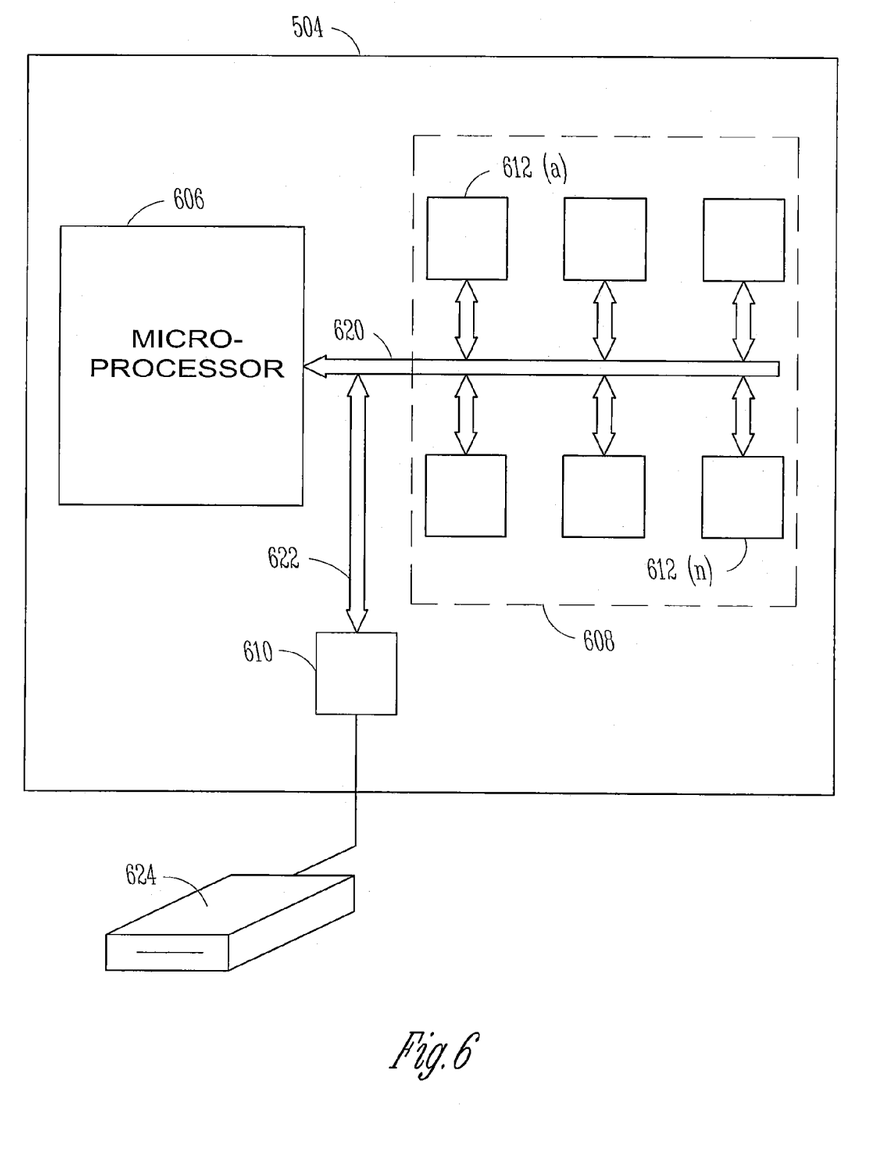
FIG. 6 shows a block diagram of a processing unit according to an embodiment of the invention.
Figure 7:
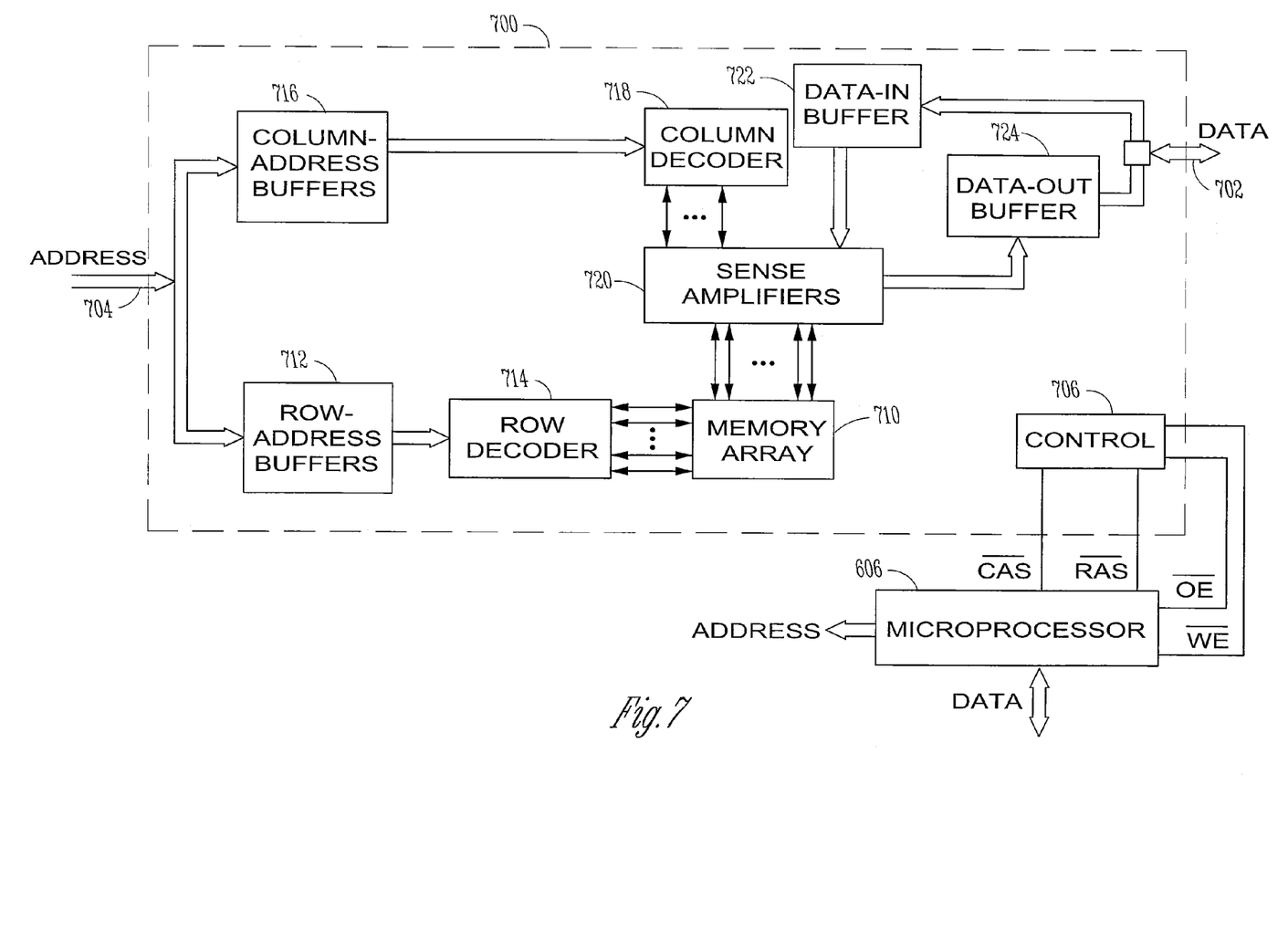
FIG. 7 shows a block diagram of a memory device according to an embodiment of the invention.

Semiconductor structures, interface, semiconductor devices, and IC's created by the methods described above may be implemented into memory devices and information handling devices as shown in FIG. 5, FIG. 6, and FIG. 7 and as described below. While specific types of memory devices and computing devices are shown below, it will be recognized by one skilled in the art that several types of memory devices and information handling devices could utilize the invention.

A personal computer, as shown in FIGS. 5 and 6, includes a monitor 500, keyboard input 502 and a central processing unit 504. The processor unit typically includes microprocessor 606, memory bus circuit 608 having a plurality of memory slots 612(a-n), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(a-n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. An alternate type of device is the extended data output (EDO) memory. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(a-n). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM.

Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Devices and methods described above include advantages such as reduced lattice mismatch at an epitaxial interface between two different semiconductor materials. One advantageous application of such an interface includes an electrical-optical communication structure. Methods such as deposition of layers at an elevated temperature provide easy formation of semiconductor structures with a modified lattice constant that permits an improved epitaxial interface.

While a number of advantages of embodiments described herein are listed above, the list is not exhaustive. Other advantages of embodiments described above will be apparent to one of ordinary skill in the art, having read the present disclosure. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A semiconductor device, comprising:
   a first semiconductor base structure;
   an epitaxial layer of a second semiconductor over at least a portion of the first semiconductor base structure; and
   an amount of a substantially electrically inert impurity element within the epitaxial layer of the second semiconductor wherein an amount of the impurity element modifies a lattice constant of the epitaxial layer to reduce lattice mismatch with the first semiconductor base structure.

2. The semiconductor device of claim 1, wherein the substantially electrically inert impurity element includes an amount of carbon.

3. The semiconductor device of claim 2, wherein the first semiconductor base structure includes a silicon base structure.

4. The semiconductor device of claim 3, wherein the epitaxial layer of the second semiconductor includes an epitaxial layer of gallium arsenide (GaAs).

5. The semiconductor device of claim 4, wherein the amount of carbon includes approximately 11.9 atomic percent carbon.

6. The semiconductor device of claim 1, wherein the epitaxial layer of the second semiconductor includes an epitaxial layer of indium phosphide (InP).

7. The semiconductor device of claim 1, wherein the first semiconductor base structure includes a germanium base structure.

8. A semiconductor device, comprising:
   a first semiconductor base structure;
   an epitaxial mesa structure of a second semiconductor over at least a portion of the first semiconductor base structure;
   an amount of carbon atoms within the epitaxial mesa structure of the second semiconductor wherein the amount of carbon atoms modifies a lattice constant of the epitaxial mesa structure to reduce lattice mismatch with the first semiconductor base structure; and and optical waveguide coupled to the epitaxial mesa structure.

9. The semiconductor device of claim 8, wherein the first semiconductor base structure includes a germanium base structure.

10. The semiconductor device of claim 8, wherein the first semiconductor base structure includes a silicon base structure.

11. The semiconductor device of claim 9, wherein the epitaxial layer of the second semiconductor includes an epitaxial layer of indium phosphide (InP).

12. The semiconductor device of claim 10, wherein the epitaxial layer of the second semiconductor includes an epitaxial layer of indium phosphide (InP).

13. The semiconductor device of claim 9, wherein the epitaxial layer of the second semiconductor includes an epitaxial layer of gallium arsenide (GaAs).

14. The semiconductor device of claim 10, wherein the epitaxial layer of the second semiconductor includes an epitaxial layer of gallium arsenide (GaAs).

15. A semiconductor device, comprising:
a first semiconductor portion;
a second epitaxial semiconductor portion of a second semiconductor formed over at least a portion of the first semiconductor portion; and
an amount of a substantially electrically inert impurity element within the second epitaxial semiconductor portion wherein the amount of impurity elements modifies a lattice constant of the second epitaxial semiconductor portion to reduce lattice mismatch with the first semiconductor portion.

16. The semiconductor device of claim 15, wherein the amount of impurity elements modifies the lattice constant as substitutional atoms in the lattice of the second epitaxial semiconductor portion.

17. The semiconductor device of claim 15, wherein the amount of impurity elements modifies the lattice constant as interstitial atoms in the lattice of the second epitaxial semiconductor portion.

18. The semiconductor device of claim 15, wherein the substantially electrically inert impurity element includes an amount of carbon.

19. The semiconductor device of claim 18, wherein the first semiconductor portion is silicon, the second semiconductor portion is gallium arsenide (GaAs), and the amount of carbon includes approximately 11.9 atomic percent carbon.

20. The semiconductor device of claim 15, further including an optical waveguide coupled to the second epitaxial semiconductor portion.

* * * * *

UNITED STATES PATENT AND TRADEMARK OFFICE
CERTIFICATE OF CORRECTION

PATENT NO. : 7,705,429 B2 Page 1 of 1
APPLICATION NO. : 12/364073
DATED : April 27, 2010
INVENTOR(S) : Paul A. Farrar It is certified that error appears in the above-identified patent and that said Letters Patent is hereby corrected as shown below:

In column 9, line 3, in Claim 8, delete "and optical" and insert -- an optical --, therefor.

Signed and Sealed this

Fifteenth Day of June, 2010

David J. Kappos
*Director of the United States Patent and Trademark Office*